(12) United States Patent
Hashino et al.

(10) Patent No.: US 11,270,968 B2
(45) Date of Patent: Mar. 8, 2022

(54) ELECTRONIC CIRCUIT CONNECTION METHOD AND ELECTRONIC CIRCUIT

(71) Applicant: NATIONAL INSTITUTE OF ADVANCED INDUSTRIAL SCIENCE AND TECHNOLOGY, Tokyo (JP)

(72) Inventors: Masaru Hashino, Tsukuba (JP); Ying Ying Lim, Tsukuba (JP); Hiroshi Nakagawa, Tsukuba (JP); Masahiro Aoyagi, Tsukuba (JP); Katsuya Kikuchi, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 16/973,020

(22) PCT Filed: May 30, 2019

(86) PCT No.: PCT/JP2019/021519
§ 371 (c)(1),
(2) Date: Dec. 7, 2020

(87) PCT Pub. No.: WO2019/239909
PCT Pub. Date: Dec. 19, 2019

(65) Prior Publication Data
US 2021/0249374 A1 Aug. 12, 2021

(30) Foreign Application Priority Data
Jun. 13, 2018 (JP) .............................. JP2018-112722

(51) Int. Cl.
*H01L 23/13* (2006.01)
*H01L 23/00* (2006.01)

(52) U.S. Cl.
CPC .............. *H01L 24/17* (2013.01); *H01L 23/13* (2013.01); *H01L 24/06* (2013.01); *H01L 24/11* (2013.01);
(Continued)

(58) Field of Classification Search
CPC ......... H01L 24/17; H01L 24/06; H01L 24/11; H01L 24/13; H01L 24/14; H01L 24/16;
(Continued)

(56) References Cited

U.S. PATENT DOCUMENTS

2008/0230903 A1* 9/2008 Sato .................. H01L 24/06
257/738
2009/0218689 A1* 9/2009 Chan .................. H01L 24/11
257/738

(Continued)

FOREIGN PATENT DOCUMENTS

JP H01278034 A 11/1989
JP 5062763 B2 10/2012
(Continued)

OTHER PUBLICATIONS

International Preliminary Report on Patentability and Written Opinion issued in PCT/JP2019/021519; dated Dec. 15, 2020.
(Continued)

*Primary Examiner* — Thanh Y. Tran
(74) *Attorney, Agent, or Firm* — Studebaker & Brackett PC (57) ABSTRACT

The purpose of the present invention is to provide an electronic circuit connection method and an electronic circuit capable of improving the reliability of electrical connection.
A connection method for an electronic circuit 100 includes: a process of forming a first metal bumps 30 and a second metal bump 40, each of which has a cone shape; and a
(Continued)

process of joining a first electrode pad 12 and a third electrode pad 22 by the first metal bump 30 and joining a second electrode pad 13 and a fourth electrode pad 23 by the second metal bump 40, wherein at least one region of between a first region 11a and a second region 11b in a first connection surface 11 and between a third region 21a and a fourth region 21b in a second connection surface 21 has a step 11c, and the first metal bump 30 and the second metal bump 40 have different heights so as to correct a height H1 of the step 11c.

11 Claims, 11 Drawing Sheets (52) U.S. Cl.
CPC .............. *H01L 24/13* (2013.01); *H01L 24/14* (2013.01); *H01L 24/16* (2013.01); *H01L 24/81* (2013.01); *H01L 24/05* (2013.01); *H01L 2224/05166* (2013.01); *H01L 2224/05644* (2013.01); *H01L 2224/06102* (2013.01); *H01L 2224/1145* (2013.01); *H01L 2224/11472* (2013.01); *H01L 2224/13018* (2013.01); *H01L 2224/141* (2013.01); *H01L 2224/1403* (2013.01); *H01L 2224/16014* (2013.01); *H01L 2224/16057* (2013.01); *H01L 2224/16145* (2013.01); *H01L 2224/1703* (2013.01); *H01L 2224/81191* (2013.01); *H01L 2224/81192* (2013.01); *H01L 2224/81203* (2013.01); *H01L 2924/10157* (2013.01); *H01L 2924/15159* (2013.01)

(58) Field of Classification Search
CPC ......... H01L 24/81; H01L 24/05; H01L 23/13; H01L 2224/06102; H01L 2224/1145; H01L 2224/11472; H01L 2224/13018; H01L 2224/1403; H01L 2224/16014; H01L 2224/16145; H01L 2224/1703; H01L 2224/81191; H01L 2224/81192; H01L 2224/81203; H01L 2924/10157; H01L 2224/0401; H01L 2224/05; H01L 2224/0603; H01L 2224/16238; H01L 2224/17104

See application file for complete search history.

(56) References Cited

U.S. PATENT DOCUMENTS

| | | | | |
|---|---|---|---|---|
| 2009/0301771 | A1* | 12/2009 | Ochi | ........................ H01L 24/11 |
| | | | | 174/260 |
| 2010/0052163 | A1* | 3/2010 | Ouchi | ................... H01L 21/563 |
| | | | | 257/737 |
| 2014/0252604 | A1 | 9/2014 | Motoyoshi | |
| 2016/0056125 | A1* | 2/2016 | Pan | .......................... H01L 25/50 |
| | | | | 257/676 |

FOREIGN PATENT DOCUMENTS

| | | |
|---|---|---|
| JP | 5565966 B2 | 8/2014 |
| JP | 5877645 B2 | 3/2016 |
| WO | 2014136241 A1 | 9/2014 |

OTHER PUBLICATIONS

International Search Report issued in PCT/JP2019/021519; dated Jul. 23, 2019.

* cited by examiner

Fig. 12

ELECTRONIC CIRCUIT CONNECTION METHOD AND ELECTRONIC CIRCUIT

TECHNICAL FIELD

The present invention relates to an electronic circuit connection method and an electronic circuit.

BACKGROUND ART

Hitherto, as a method for mounting a semiconductor element, there has been known a method in which an electrically conductive protrusion projecting from a surface of a semiconductor element is provided on an electrode portion of the semiconductor element, the protrusion is preliminarily pressed against a rigid plane, an adhesive is applied to at least one of a substrate and the semiconductor element, pressure is applied to the semiconductor element such that the protrusion and an electrode pattern come into contact with each other to be joined, and then an adhesive resin is cured (refer to Patent Document 1). Further, as a device for forming micro metal bumps, there has been known a device for forming micro metal bumps which includes: a substrate holding means that holds a substrate on which a hole pattern exposing a predetermined portion of metal wiring is formed on a mask layer; and a metal microparticle ejecting means that ejects metal microparticles together with a carrier gas through a nozzle to the held substrate, the ejected metal microparticles being deposited at a predetermined location of a metal wiring to form a cone-shaped metal bump by a gas deposition method, wherein the substrate holding means has a cooling member which is formed in a size and shape larger than the lower surface of the substrate and which is composed of a metal heat radiation plate that holds the substrate from the other surface side, a flexible thermally conductive sheet interposed between the substrate and the cooling member, and a fixing member which fixes the substrate to the cooling member in a state in which a peripheral edge portion on one surface side of the substrate is pressed, and which is composed of a metal heat radiation member in surface contact with at least the peripheral edge portion on the one surface side of the substrate and the cooling member (refer to Patent Document 2). In addition, as a method for mounting components, there has been known a method for mounting components, in which an electronic component having a plurality of bumps on one surface of a plate-like main body is held by a bonding head, a circuit board is held by a stage such that a plurality of pads face the respective bumps, the bumps and the pads are brought into contact with each other, and the bonding head is moved close to the stage to press the bumps to cause the bumps to deform by an amount that will not lead to defective contact with the pads, thus mounting the electronic component on the circuit board, a first position measurement process is performed, which measures a first position of the bonding head when a load applied to the electronic component through the bonding head by the bumps and the pads coming in contact due to an approach operation for bringing the bonding head close to the stage reaches a first load value, then the approach operation is stopped when the load applied to the electronic component through the bonding head reaches a second load value that exceeds the first load value, and then a second position measurement process is performed, which measures a second position of the bonding head when the load applied to the electronic component through the bonding head is reduced until returning to the first load value, and a bump deformation amount calculation process is performed, which calculates the deformation amount of each of the bumps from the difference between the first position and the second position (refer to Patent Document 3). Further, as a mounting method, there has been known a mounting method in which a pillar bump provided on a chip is mounted on an electrode provided on a substrate through solder provided on the pillar bump while heating and pressing to perform thermocompression bonding, and which mounting method has a process of holding the chip by a thermocompression bonding tool and lowering the chip toward the substrate, a process of increasing a temperature of the thermocompression bonding tool holding the chip to a solder melting temperature after the pillar bump of the chip comes in contact with the electrode of the substrate, a first reaction force measurement process of pressing the chip into the substrate by a preset press-in amount and measuring a reaction force from the electrode of the substrate upon completion of the pressing in, a second reaction force measurement process of measuring the reaction force from the electrode of the substrate when the solder provided on the pillar bump melts, and a reaction determination process of determining a change in the reaction attributable to melting of the solder on the basis of a measurement result of the first reaction force measurement process and a measurement result of the second reaction force measurement process and determining whether the pillar bump with the melted solder is aligned with the electrode (refer to Patent Document 4).

CITATION LIST

Patent Document

Patent Document 1: Japanese Patent Application Laid-Open No. 1-278034
Patent Document 2: Japanese Patent No. 5062763
Patent Document 3: Japanese Patent No. 5565966
Patent Document 4: Japanese Patent No. 5877645

SUMMARY

Technical Problem

However, according to the techniques disclosed in Patent Documents 1 to 4, regarding the connection surface between pads and bumps, if there is a difference in height over an area that is larger than bumps, then it has been difficult to join, for example, both a bump provided at a place of a lower height and a bump provided at a place of a higher height with the same electrical characteristics. Therefore, the electrical connection, for example, between a package substrate having one connection surface and a device chip having the other connection surface has been exhibiting low reliability.

Hence, an object of the present invention is to provide an electronic circuit connection method and an electronic circuit capable of improving the reliability of electrical connection.

Solution to Problem

An electronic circuit connection method according to one aspect of the present invention is an electronic circuit connection method for electrically connecting a first connection surface, in which a first electrode pad is provided in a first region and a second electrode pad is provided in a second region, and a second connection surface, in which a third electrode pad is provided in a third region facing the first region and a fourth electrode pad is provided in a fourth region facing the second region, including: a process of forming a first metal bump and a second metal bump, each of which has a cone shape; and a process of joining the first electrode pad and the third electrode pad by the first metal bump and joining the second electrode pad and the fourth electrode pad by the second metal bump, wherein at least one region of between the first region and the second region in the first connection surface and between the third region and the fourth region in the second connection surface has a step, and the first metal bump and the second metal bump have different heights so as to correct a height of the step.

An electronic circuit according to another aspect of the present invention has a first constituent element having a first connection surface in which a first electrode pad is provided in a first region and a second electrode pad is provided in a second region; a second constituent element having a second connection surface in which a third electrode pad is provided in a third region facing the first region and a fourth electrode pad is provided in a fourth region facing the second region; a first metal bump which has a cone shape and which joins the first electrode pad and the third electrode pad; and a second metal bump which has a cone shape and which joins the second electrode pad and the fourth electrode pad, wherein at least one region of between the first region and the second region in the first connection surface and between the third region and the fourth region in the second connection surface has a step, and the first metal bump and the second metal bump have different heights so as to correct a height of the step.

Advantageous Effects of Invention

The present invention makes it possible to provide an electronic circuit connection method and an electronic circuit capable of improving the reliability of electrical connection.

DESCRIPTION OF EMBODIMENTS

The following will describe an embodiment of the present invention. In the following description of the drawings, the same or similar constituent elements are denoted by the same or similar reference signs. The drawings are illustrative, and the dimensions and shapes of respective parts are schematic and should not be interpreted as limiting the technical scope of the present invention to the embodiment.

Figure 1:
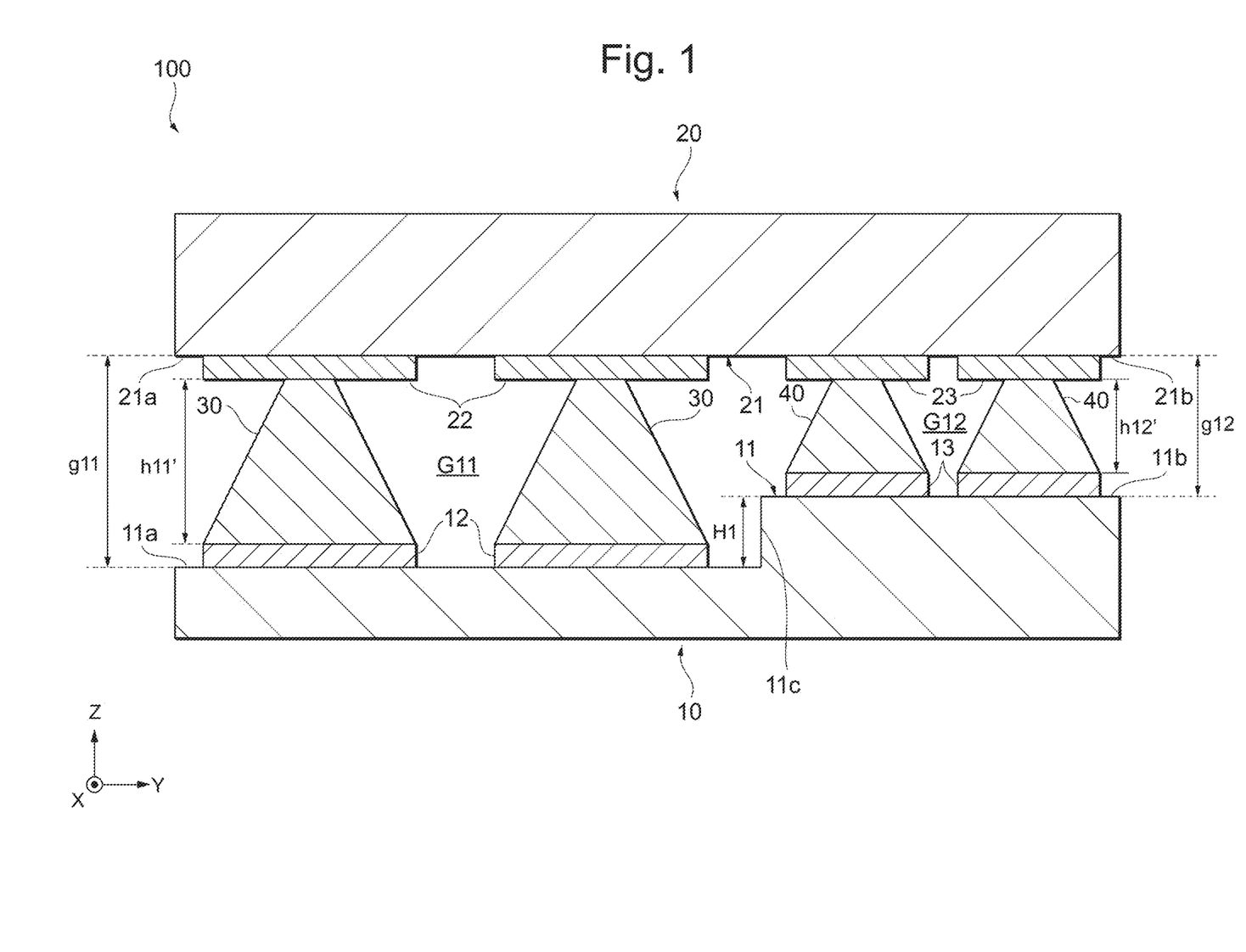
FIG. 1 is a sectional view schematically illustrating an example of the configuration of an electronic circuit according to an embodiment of the present invention.

First, referring to FIG. 1, an electronic circuit according to an embodiment of the present invention will be described. FIG. 1 is a sectional view schematically illustrating an example of the configuration of an electronic circuit 100 according to the embodiment of the present invention.

As illustrated in FIG. 1, the electronic circuit 100 according to the present embodiment includes a circuit board 10, a semiconductor device 20, first metal bumps 30, and second metal bumps 40. In the present embodiment, the circuit board 10 corresponds to an example of "the first constituent element" of the present invention, and the semiconductor device 20 corresponds to an example of "the second constituent element" of the present invention.

The circuit board 10 is not limited in its type, but is, for example, a multilayer wiring circuit board which uses a semiconductor (Si, Ge, GaN, SiC, GaAs, InP, CdTe or the like) substrate, an organic resin substrate, or an inorganic ceramic substrate as its base material thereof and which has metal wiring formed in multiple layers. The circuit board 10 has a first connection surface 11 on a positive direction side of a Z-axis. In the first connection surface 11, first electrode pads 12 are provided in a first region 11a, and second electrode pads 13 are provided in a second region 11b.

The first electrode pads 12 and the second electrode pads 13 are each electrically connected to an electronic circuit (not illustrated) provided on the circuit board 10. The first electrode pads 12 and the second electrode pads 13 are not particularly limited in their materials, but each includes, for example, a titanium (Ti) layer as a base and further includes a gold (Au) layer on a surface of the titanium layer.

The first connection surface 11 has a step 11c between the first region 11a and the second region 11b. The step 11c has a height H1, the height H1 being, for example, 0.1 μm or more and 100 μm or less.

The semiconductor device 20 is not limited in its type, but is an electronic component, such as, for example, an IC (Integrated Circuit) chip. The semiconductor device 20 has a second connection surface 21, which is a surface on a negative direction side of the Z-axis and which faces the first connection surface 11 of the circuit board 10. The second connection surface 21 is substantially a flat surface, third electrode pads 22 being provided in a third region 21a that faces the first region 11a of the first connection surface 11, and fourth electrode pads 23 being provided in a fourth region 21b that faces the second region 11b of the first connection surface 11.

The third electrode pads 22 and the fourth electrode pads 23 are each electrically connected to an electronic circuit (not illustrated) provided in the semiconductor device 20. The third electrode pads 22 and the fourth electrode pads 23 are not particularly limited in their material, but each includes, for example, a titanium (Ti) layer as a base and further includes a gold (Au) layer on a surface of the titanium layer.

The first metal bumps 30 are configured of an electrically conductive material, such as, for example, gold (Au). The first metal bumps 30 join the first electrode pads 12 of the first connection surface 11 and the third electrode pads 22 of the second connection surface 21. Thus, the circuit board 10 and the semiconductor device 20 are electrically connected by the first metal bumps 30.

The first metal bumps 30 have a cone shape. The first metal bumps 30 are first formed on the first electrode pads 12. At this time, the shape of the first metal bumps 30 is a cone shape. The cone-shaped first metal bumps 30 are characterized by a large amount of compression in response to an applied load, not easily spreading when compressed. Consequently, the tip portions are compressed to accommodate variations in formed height, thus enabling easy joining, and short-circuiting between bumps caused by the bumps spreading due to a load is prevented, so that the first metal bumps 30 can be arranged at a narrow pitch interval of, for example, a μm level.

When the first electrode pads 12 and the third electrode pads 22 are joined, the applied load causes the apexes of the first metal bumps 30 to be compressed and deformed. As a result, the shape of the first metal bumps 30 turns into a substantially cone shape with a substantially flat apex.

The "cone shape" in the present application is not limited to a case where the shape is strictly a cone shape, and is meant to include a substantially cone shape in which the tip portion is deformed as described above.

After joining, the first metal bumps 30 have a height h11'. On the other hand, the diameter of the first metal bumps 30 is, for example, 3 μm or more and 50 μm or less. The diameter of the first metal bumps 30 is preferably 3 μm or more and 30 μm or less, and more preferably 3 μm or more and 10 μm or less.

The second metal bumps 40 are configured of an electrically conductive material, such as, for example, gold (Au). The second metal bumps 40 join the second electrode pads 13 of the first connection surface 11 and the fourth electrode pads 23 of the second connection surface 21. Thus, the circuit board 10 and the semiconductor device 20 are electrically connected by the second metal bumps 40.

The second metal bumps 40 have a cone shape. The second metal bumps 40 are first formed on the second electrode pads 13. At this time, the shape of the second metal bumps 40 is a cone shape. The cone-shaped second metal bumps 40 are characterized by a large amount of compression in response to an applied load, not easily spreading when compressed. Consequently, the tip portions are compressed to accommodate variations in formed height, thus enabling easy joining, and short-circuiting between bumps caused by the bumps spreading due to a load is prevented, so that the second metal bumps 40 can be arranged at a narrow pitch interval of, for example, a μm level.

When the second electrode pads 13 and the fourth electrode pads 23 are joined, the applied load causes the apexes of the second metal bumps 40 to be compressed and deformed. As a result, the shape of the second metal bumps 40 turns into a substantially cone shape with a substantially flat apex. After joining, the second metal bumps 40 have a height h12'. On the other hand, the diameter of the second metal bumps 40 is, for example, 3 μm or more and 50 μm or less. The diameter of the first metal bumps 30 is preferably 3 μm or more and 30 μm or less, and more preferably 3 μm or more and 10 μm or less.

The tip portion of each of the first metal bumps 30 and the second metal bumps 40 is compressed under a predetermined load. Although details will be described later, the inventors of the present invention have found that when a predetermined load is applied, the amount of compression at the tip portion of each of the first metal bumps 30 and the second metal bumps 40, which differ in height, is substantially the same. Consequently, by applying a predetermined load to compress, the amount of compression at the tip portion of each of the first metal bumps 30 and the second metal bumps 40 will be substantially the same, enabling the joining condition in a joining surface of the first metal bumps 30 and the joining condition in a joining surface of the second metal bumps 40 to be substantially the same.

The first metal bumps 30 and the second metal bumps 40 have different heights (height h11'≠height h12') so as to correct the height H1 of the step 11c of the first connection surface 11.

More specifically, the height h11' of the first metal bumps 30 is larger than the height h12' of the second metal bumps 40 (height h11'>height h12'), and the difference is substantially the same as the height H1 of the step 11c (height h11'−height h12'≈height H1).

As described above, the first metal bumps 30 and the second metal bumps 40 have the different heights so as to correct the height H1 of the step 11c of the first connection surface 11, thus making it possible to reduce the difference in joining condition, such as a joining force in the joining surfaces, which may occur due to the height H1 of the step 11c. Consequently, homogeneous joining that has good electrical characteristics can be achieved, enabling the reliability of electrical connection to be improved.

Further, a first gap G11 is formed between the first region 11a of the first connection surface 11 and the third region 21a of the second connection surface 21, and a second gap G12 is formed between the second region 11b of the first connection surface 11 and the fourth region 21b of the second connection surface 21. The height h11' of the first metal bumps 30 is proportional to a height g11 of the first gap G11, and the height h12' of the second metal bumps 40 is proportional to a height g12 of the second gap G12. This makes it possible to set the joining condition in the joining surface of the first metal bumps 30 and the joining condition in the joining surface of the second metal bumps 40 to be substantially the same. Thus, homogeneous joining that has good electrical characteristics can be achieved, enabling the reliability of electrical connection to be further improved.

Further, the first metal bumps 30 and the second metal bumps 40 each differ in height, but has the similar cone shape. This makes it possible to reduce the difference in the joining condition in the joining surfaces that may occur due to dissimilarity.

Figure 2:
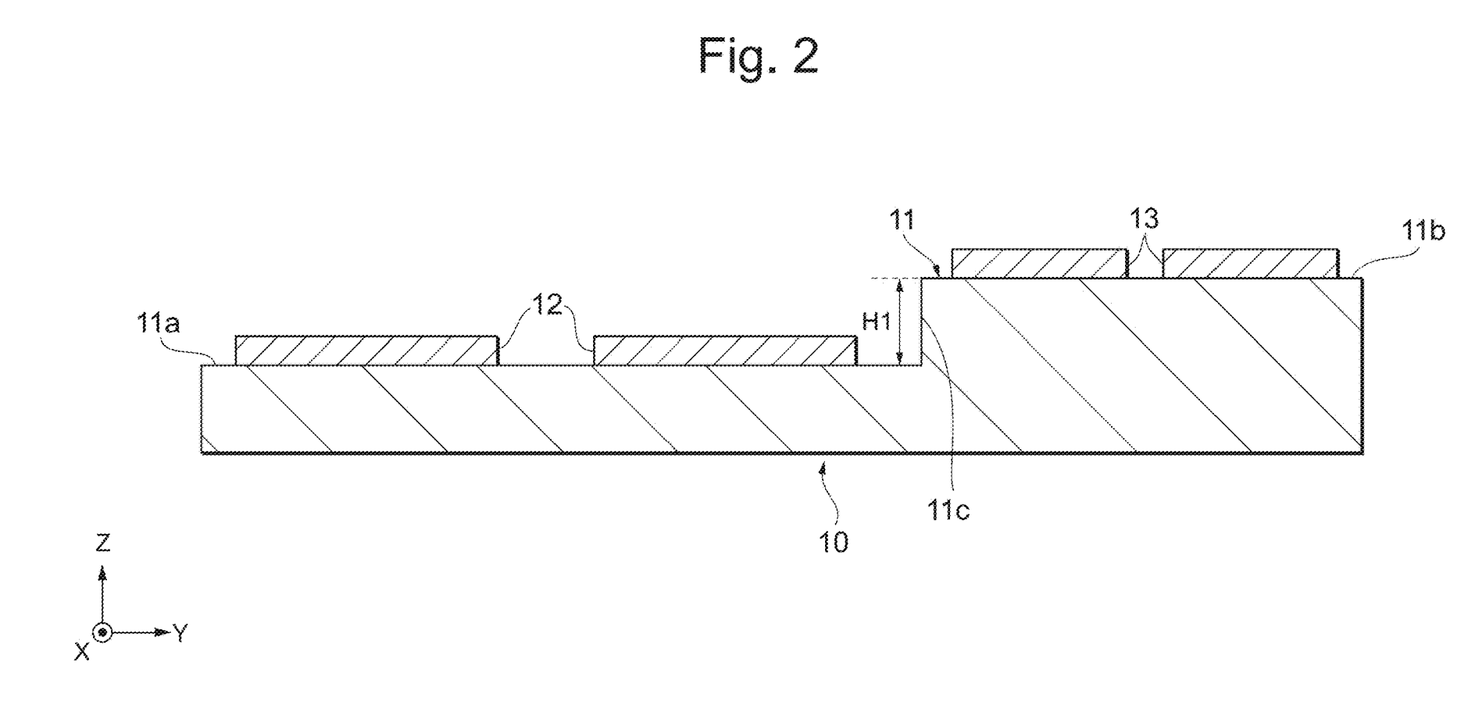
FIG. 2 is a diagram illustrating an example of an electronic circuit connection method according to the embodiment of the present invention.
Figure 3:
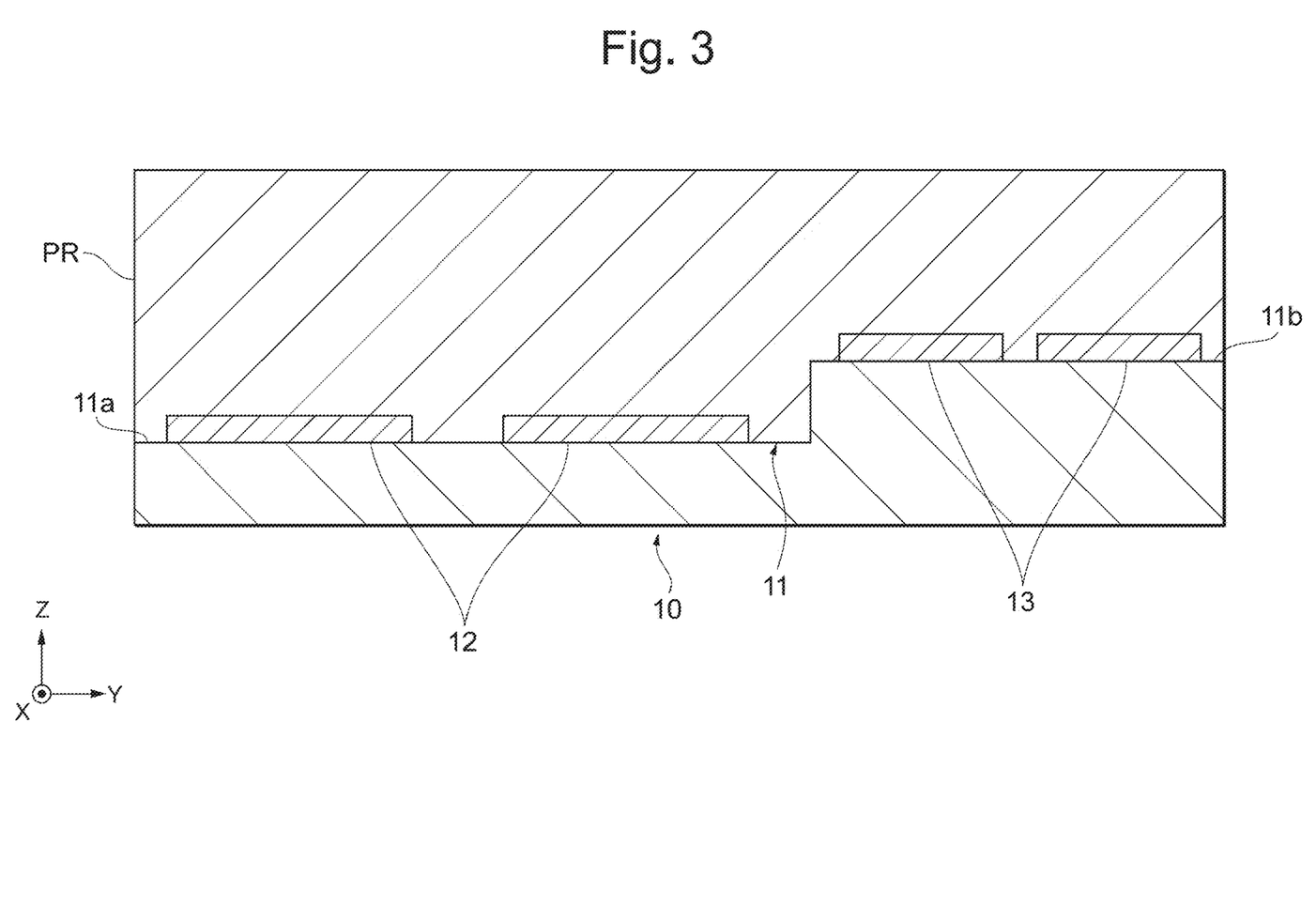
FIG. 3 is a diagram illustrating an example of the electronic circuit connection method according to the embodiment of the present invention.
Figure 4:
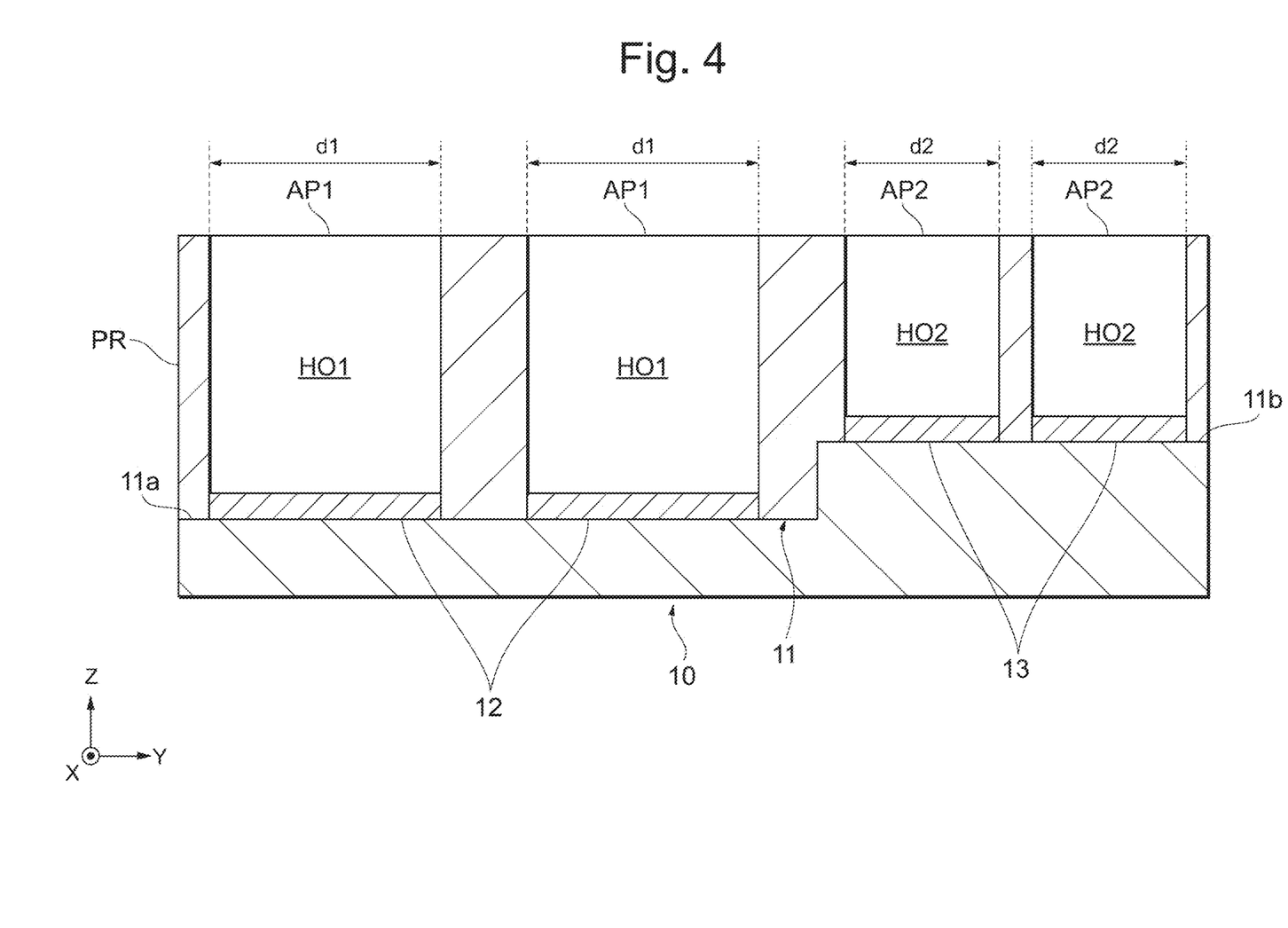
FIG. 4 is a diagram illustrating an example of the electronic circuit connection method according to the embodiment of the present invention.
Figure 5:
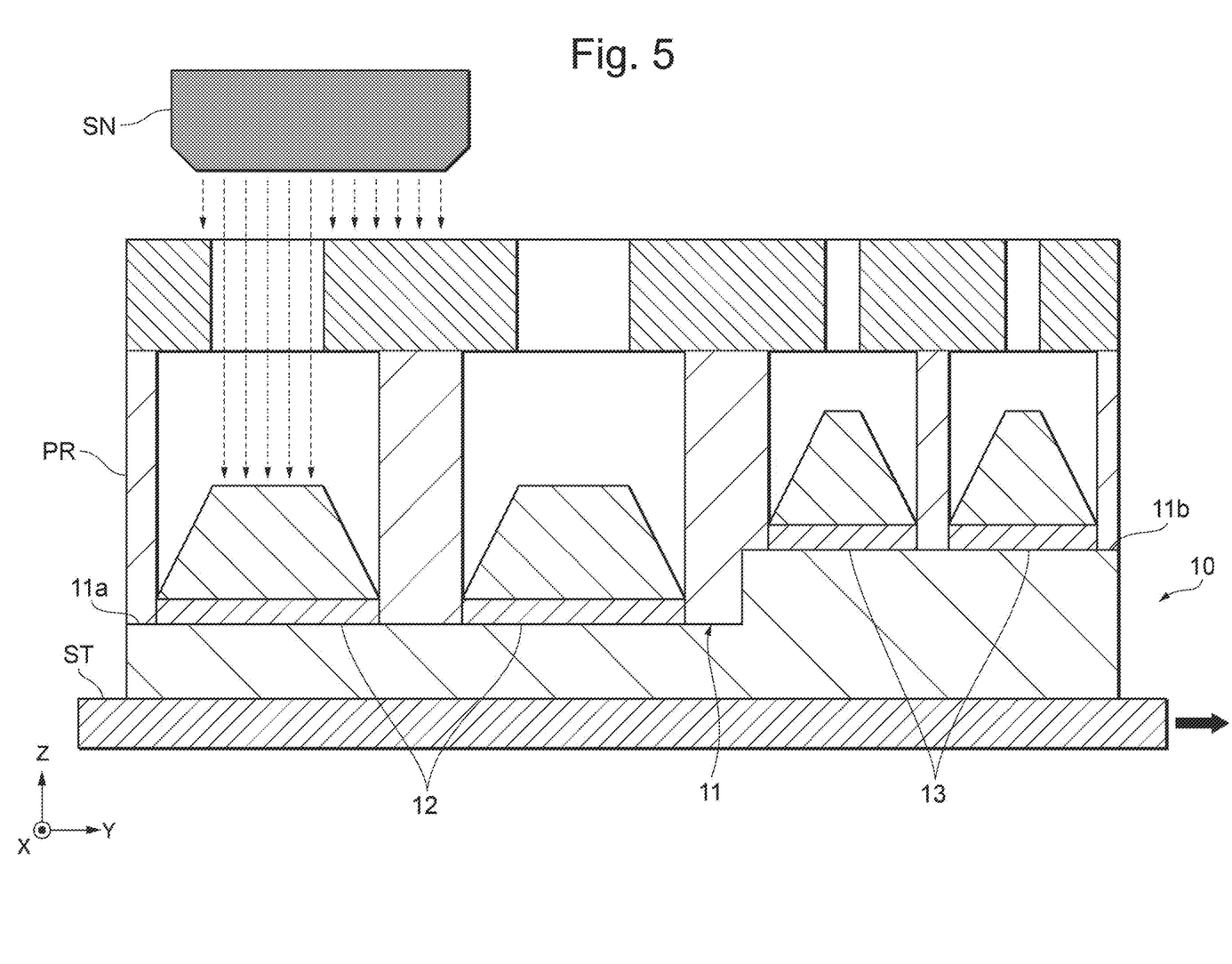
FIG. 5 is a diagram illustrating an example of the electronic circuit connection method according to the embodiment of the present invention.
Figure 6:
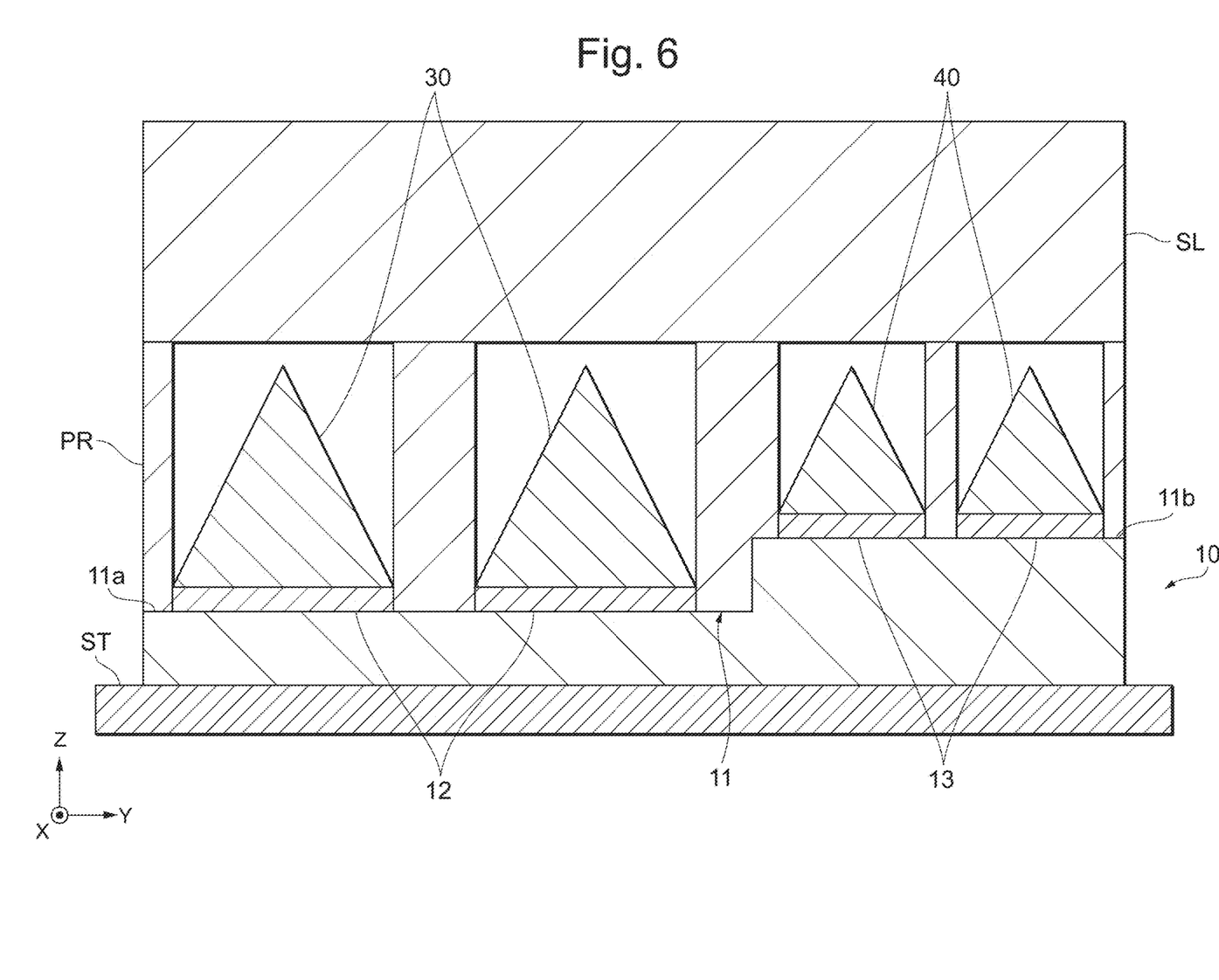
FIG. 6 is a diagram illustrating an example of the electronic circuit connection method according to the embodiment of the present invention.
Figure 7:
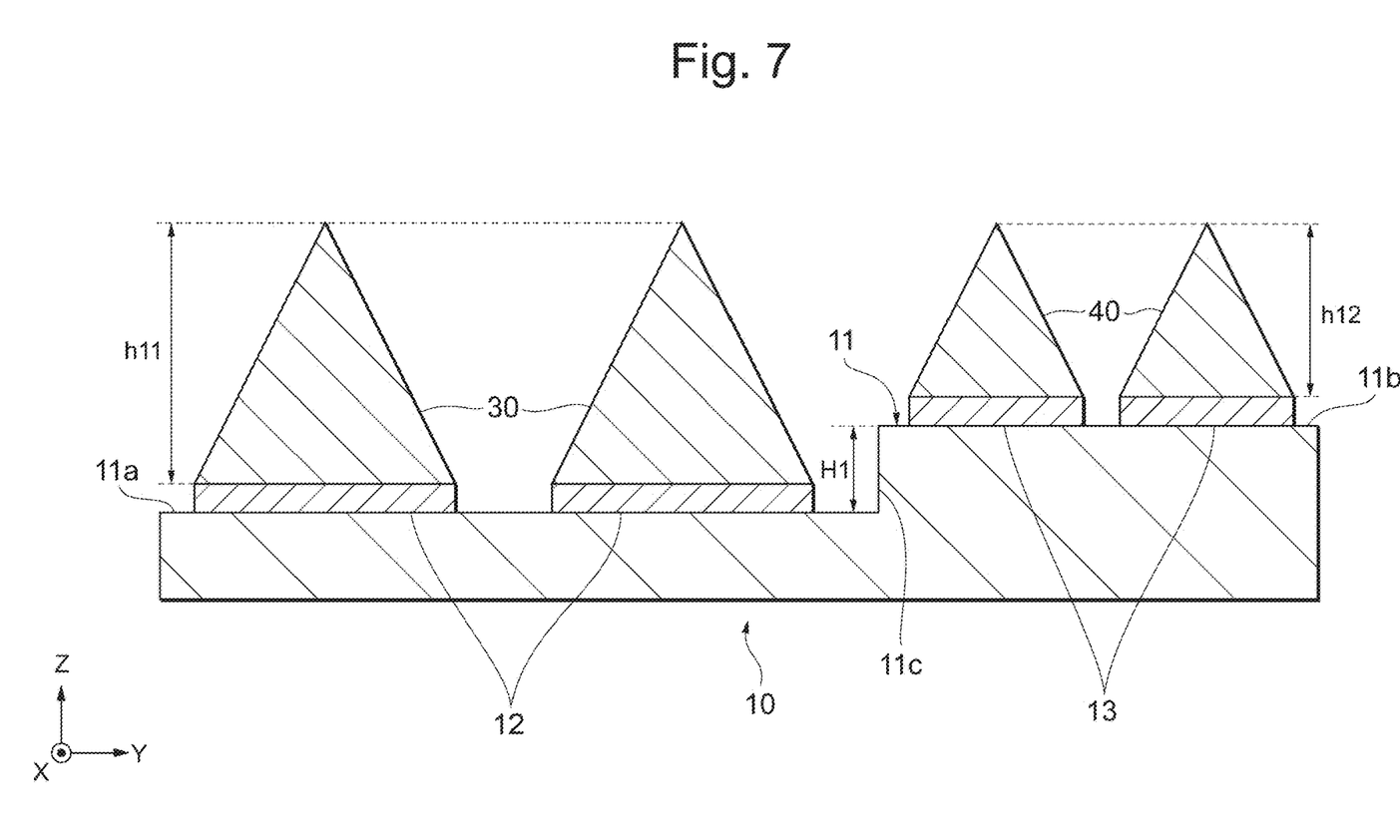
FIG. 7 is a diagram illustrating an example of the electronic circuit connection method according to the embodiment of the present invention.
Figure 8:
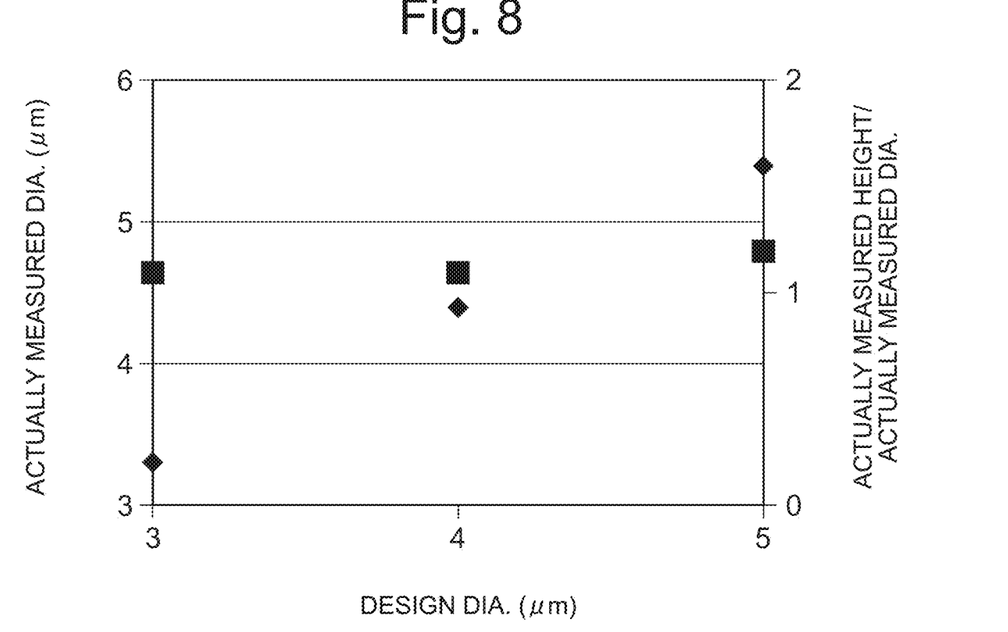
FIG. 8 is a graph illustrating the measurement results of metal bumps formed by the electronic circuit connection method according to the embodiment of the present invention.
Figure 9:
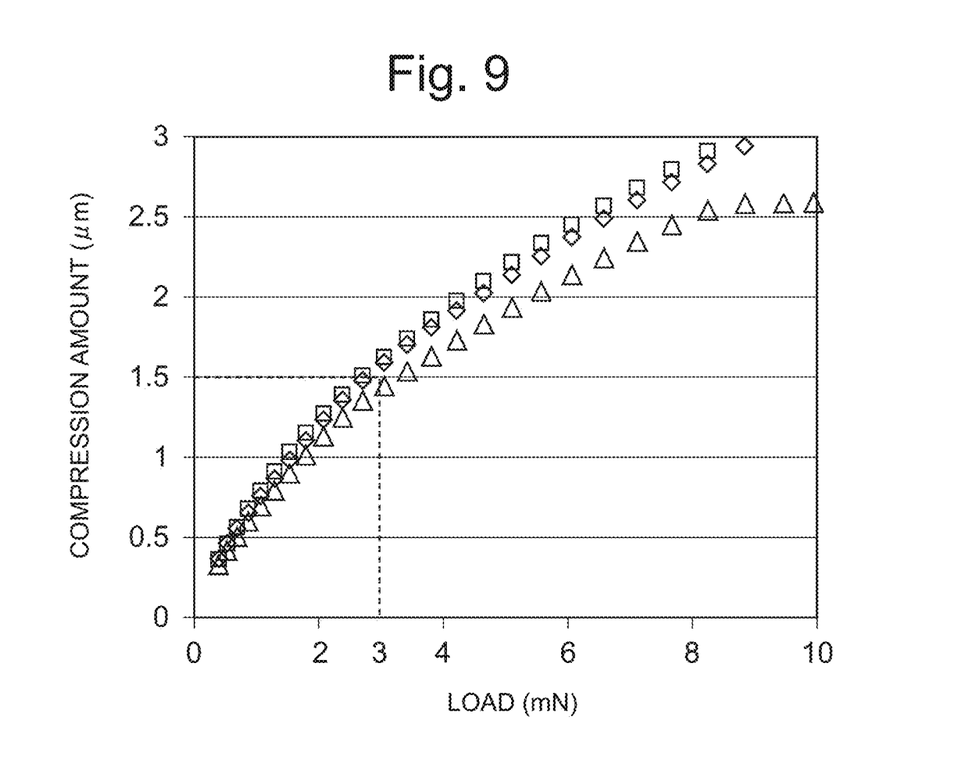
FIG. 9 is a graph illustrating the experiment results of the metal bumps formed by the electronic circuit connection method according to the embodiment of the present invention.
Figure 10:
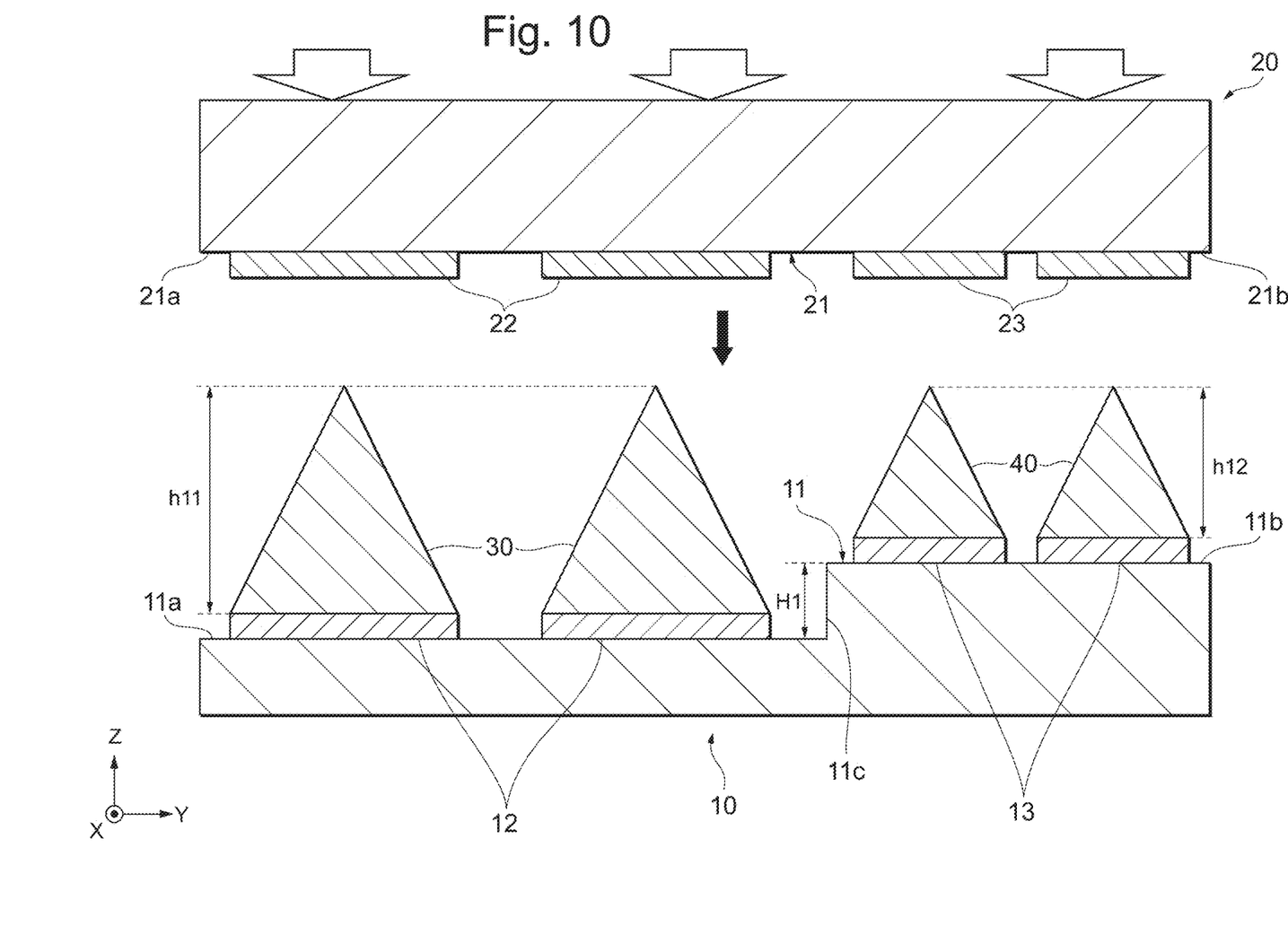
FIG. 10 is a diagram illustrating an example of the electronic circuit connection method according to the embodiment of the present invention.

Referring now to FIG. 2 to FIG. 10, an electronic circuit connection method according to an embodiment of the present invention will be described. FIG. 2 is a diagram illustrating an example of the electronic circuit connection method according to the embodiment of the present invention. FIG. 3 is a diagram illustrating an example of the electronic circuit connection method according to the embodiment of the present invention. FIG. 4 is a diagram illustrating an example of the electronic circuit connection method according to the embodiment of the present invention. FIG. 5 is a diagram illustrating an example of the electronic circuit connection method according to the embodiment of the present invention. FIG. 6 is a diagram illustrating an example of the electronic circuit connection method according to the embodiment of the present invention. FIG. 7 is a diagram illustrating an example of the electronic circuit connection method according to the embodiment of the present invention. FIG. 8 is a graph illustrating the measurement results of metal bumps formed by the electronic circuit connection method according to the embodiment of the present invention. FIG. 9 is a graph illustrating the experiment results of the metal bumps formed by the electronic circuit connection method according to the embodiment of the present invention. FIG. 10 is a diagram illustrating an example of the electronic circuit connection method according to the embodiment of the present invention. In FIG. 2 to FIG. 7 and FIG. 10, for the sake of convenience, a description will be given by illustrating a part of an electronic circuit connected by the connection method.

According to the electronic circuit connection method, a circuit board 10 is first prepared in advance, as illustrated in FIG. 2. The circuit board 10 has the first connection surface 11 on the positive side of the Z-axis direction. The first electrode pads 12 are formed in the first region 11a of the first connection surface 11, and the second electrode pads 13 are formed in second region 11b of the first connection surface 11. The first electrode pads 12 and the second electrode pads 13 are formed by a method such as, for example, sputtering. Further, the first connection surface 11 has the step 11c of the height H1 between the first region 11a and the second region 11b.

Next, as illustrated in FIG. 3, a photoresist film PR is formed on the first connection surface 11 of the circuit board 10. The photoresist film PR is formed by a method such as, for example, spin coating. The material of the photoresist film PR is not limited in type, but, for example, ZR8800 of TOKYO OHKA KOGYO CO., LTD., or AZP4903, AZP4620, or AZP4930 of MERCK is used as a positive photoresist.

Next, in the photoresist film PR, first holes HO1 are formed at positions corresponding to the first electrode pads 12 and second holes HO2 are formed at positions corresponding to the second electrode pads 13, as illustrated in FIG. 4. Thus, the first electrode pads 12 and the second electrode pads 13 are exposed.

Diameters d1 at openings AP1 of the first holes HO1 and diameters d2 at openings AP2 of the second holes HO2 are different (diameters d1≠diameters d2). More specifically, the diameters d1 of the openings AP1 of the first holes HO1 are larger than the diameters d2 of the openings AP2 of the second holes HO2 (height h11'>height h12').

The first holes HO1 and the second holes HO2 are each formed using, for example, a photolithography technique. Specifically, the first holes HO1 and the second holes HO2 are formed by irradiating the photoresist film PR with light rays to perform etching by using a light shielding material such as a patterned mask (reticle).

Next, the first metal bumps 30 are formed on the first electrode pads 12, and the second metal bumps 40 are formed on the second electrode pads 13. The first metal bumps 30 and the second metal bumps 40 are formed using, for example, a gas deposition method.

Specifically, as illustrated in FIG. 5, the circuit board 10 on which the photoresist film PR has been formed is placed on a stage device ST in a room under reduced pressure conditions. A gas containing nano-sized metal particles is sprayed from a spray nozzle SN toward the photoresist film PR, which is moved in the positive direction of the Y-axis together with the stage device ST. The metal particles are, for example, gold (Au) particles produced by an in-gas deposition method. The sprayed metal particles are deposited on the photoresist film PR in the positive direction of the Z-axis and also deposited inside the first holes HO1 and the second holes HO2, respectively. The gas blown inside the first holes HO1 and the second holes HO2 generates convection, and the metal particles deposited on the photoresist film PR extend in the X-direction and the Y-axis direction, forming an eaves structure.

The eaves structure of the metal particles deposited on the photoresist film PR gradually grows as the stage device ST is moved and the photoresist film PR is scanned a plurality of times with respect to the spray nozzle SN. With this growth, the openings AP1 and AP2 of the first holes HO1 and the second holes HO2, respectively, are gradually closed, and the metal particles deposited inside the first holes HO1 and the second holes HO2 are formed into tapered shapes. Finally, as illustrated in FIG. 6, the openings AP1 and AP2 of the first holes HO1 and the second holes HO2, respectively, are closed, and a sediment layer SL is formed on the photoresist film PR. Further, the first metal bumps 30 with pointed tips are formed inside the first holes HO1, and the second metal bumps 40 with pointed tips are formed inside the second holes HO2.

The first metal bumps 30 and the second metal bumps 40 are almost simultaneously formed together at the same timing by a gas deposition method. Consequently, the forming time of the first metal bumps 30 and the second metal bumps 40 can be shortened, as compared with the case where the first metal bumps 30 and the second metal bumps 40 are separately formed.

The first metal bumps 30 and the second metal bumps 40 each have a cone shape. Further, the shape of the first metal bumps 30 depends on the shape of the openings AP1 of the first holes HO1 illustrated in FIG. 4. More specifically, if, for example, the shape of the openings AP1 of the first holes HO1 is circular, then the shape of the first metal bumps 30 will be conical, and if the shape of the openings AP1 of the first holes HO1 is square, then the first metal bumps 30 will be square pyramidal. Similarly, the shape of the second metal bumps 40 depends on the shape of the openings AP2 of the second holes HO2 illustrated in FIG. 4.

In the present embodiment, the example has been described, in which the circuit board 10 on which the photoresist film PR has been formed is placed on the stage device ST, and the stage device ST is moved with respect to the fixed spray nozzle SN, however, the present invention is not limited thereto. For example, instead of moving the stage device ST, or in synchronization with the movement of the stage device ST, the spray nozzle SN may be moved Next, as illustrated in FIG. 7, the photoresist film PR on which the sediment layer SL has been formed is lifted off, i.e., removed, from the first connection surface 11 of the circuit board 10. The photoresist film PR is removed by, for example, a solvent or a stripper.

As described above, the formation of the first metal bumps 30 and the second metal bumps 40 is performed by forming the photoresist film PR on the first connection surface 11, forming the first holes HO1 and the second holes HO2 respectively having different opening diameters on the photoresist film PR, depositing the metal particles inside each of the first holes HO1 and the second holes HO2 by spraying a gas containing metal particles toward the photoresist film PR, and removing the photoresist film PR from the first connection surface 11. This makes it possible to easily form the first metal bumps 30 and the second metal bumps 40, which have different heights.

The diameter and the height h11 of the first metal bumps 30 are respectively proportional to a diameter d1 of the openings AP1 of the first holes HO1 illustrated in FIG. 4. Similarly, the diameter and the height h12 of the second metal bumps 40 are respectively proportional to a diameter d2 of the openings AP2 of the second holes HO2 illustrated in FIG. 4.

Regarding metal bumps formed by the method illustrated in FIG. 2 to FIG. 7, as with the first metal bumps 30 and the second metal bumps 40, the actually measured diameters of the metal bumps denoted by the rhombic plot have approximate linearity in the range of 3 μm to 5 μm of design diameter, and the difference between the design diameter and the actually measured diameter is 0.4 μm in every case where the design diameter is 3 μm, 4 μm and 5 μm, as illustrated in FIG. 8. On the other hand, the ratio between the height and the diameter of the metal bumps denoted by the square plot remained substantially constant in the range of 3 μm to 5 μm of design diameter, and the value was approximately 1. The metal bumps used for the measurement of FIG. 8 were formed as described below. First, electrode pads including Ti layers and Au layers are formed on a Si substrate. Then, a photoresist film having a thickness (height) of 7 μm is formed on the Si substrate by using ZR8800. Then, holes having openings, the diameters of which are 3 μm, 4 μm and 5 μm, respectively, are formed in the photoresist film to form conical metal bumps.

Consequently, a height h12 of the first metal bumps 30 is proportional to the diameter d1 of the openings AP1 of the first holes HO1 illustrated in FIG. 4, and the height h12 of the second metal bumps 40 is proportional to the diameter d2 of the openings AP2 of the second holes HO2 illustrated in FIG. 4. This makes it possible to change the height h12 of the first metal bumps 30 by the diameter d1 of the openings AP1 of the first holes HO1 formed in the photoresist film PR, and to change the height h12 of the first metal bumps 30 by the diameter d2 of the openings AP2 of the second holes HO2.

Further, the compression amounts of all metal bumps having a design diameter of 3 μm denoted by the triangular plot, metal bumps having a design diameter of 4 μm denoted by the rhombic plot, and metal bumps having a design diameter of 5 μm denoted by the square plot, which were formed by the method illustrated in FIG. 2 to FIG. 7, were approximately 1.5 μm with respect to a load amount of 3 mN, as illustrated in FIG. 9. In addition, the compression amounts of all metal bumps having the design diameter of 3 μm, the metal bumps having the design diameter of 4 μm, and the metal bumps having the design diameter of 5 μm were substantially the same with respect to a load amount in the range of more than 0 mN and 3 mN or less. The metal bumps used for the experiment of FIG. 9 are the same as the metal bumps used for the measurement of FIG. 8.

Meanwhile, the semiconductor device 20 is prepared in advance, as illustrated in FIG. 10. The semiconductor device 20 has the second connection surface 21 on the negative direction side of the Z-axis. The third electrode pads 22 are formed in the third region 21a of the second connection surface 21, and the fourth electrode pads 23 are formed in the fourth region 21b of the second connection surface 21.

The second connection surface 21 of the semiconductor device 20 is placed, facing the first connection surface 11 of the circuit board 10 from which the photoresist film PR with the sediment layer SL formed thereon has been removed. At this time, the third region 21a of the second connection surface 21 faces the first region 11a of the first connection surface 11, and the fourth region 21b of the second connection surface 21 faces the second region 11b of the first connection surface 11.

Then, as indicated by the black arrow in FIG. 10, the semiconductor device 20 is moved in the negative direction of the Z-axis to bring the third electrode pads 22 into contact with the tips of the first metal bumps 30 and to bring the fourth electrode pads 23 into contact with the tips of the second metal bumps 40. Further, as indicated by the white arrows in FIG. 10, a pressure is applied to the semiconductor device 20 thereby to apply a predetermined load to the first metal bumps 30 and the second metal bumps 40. Consequently, the tip portions of the first metal bumps 30 and the tip portions of the second metal bumps 40 are respectively compressed.

Thus, as illustrated in FIG. 1, the first metal bumps 30 join the first electrode pads 12 and the third electrode pads 22, and the second metal bumps 40 join the second electrode pads 13 and the fourth electrode pads 23, thereby electrically connecting the first connection surface 11 of the circuit board 10 of the electronic circuit 100 and the second connection surface 21 of the semiconductor device 20 of the electronic circuit 100.

The joining by the first metal bumps 30 and the second metal bumps 40 is preferably joining by thermocompression bonding. More specifically, first, the surface on the positive direction side of the Z-axis in the semiconductor device 20 is suctioned to a heater head (not illustrated). Then, a sensor head is moved to face the second connection surface 21 of the semiconductor device 20 to the first connection surface 11 of the circuit board 10, and the semiconductor device 20 is positionally aligned with the circuit board 10, with a gap provided between the two surfaces. Subsequently, the heater head is heated to a predetermined heating temperature and then the heater head is moved in the negative direction of the Z-axis.

It is recognized that the ease of deformation of the cone-shaped metal bumps depends on temperature and that the ease of deformation tends to increase as temperature increases. For this reason, the temperature is preferably maintained to be constant so as to control the compression amount of the metal bumps. Further, a predetermined heating temperature at the time of joining is preferably low so as to reduce the residual stress that occurs at a joined portion due to a difference in coefficient of thermal expansion. On the other hand, the electrical resistance of a formed joint tends to be higher as the temperature is lower. Therefore, it is necessary to set the predetermined heating temperature at the time of joining according to required electrical resistance.

After the tips of the first metal bumps 30 come in contact with the third electrode pads 22 and the tips of the second metal bumps 40 come in contact with the fourth electrode pads 23, the heater head is moved further in the negative direction of the Z-axis, and a pressure is applied to the first metal bumps 30 and the second metal bumps 40. At this time, the compression amount of the tip portions of the first metal bumps 30 and the compression amount of the tip portions of the second metal bumps 40 become substantially constant as described above by controlling the heater head such that a predetermined load is applied to the first metal bumps 30 and the second metal bumps 40. This makes it possible to perform the thermocompression bonding by the first metal bumps 30 and the second metal bumps 40 while maintaining the parallelism between the second connection surface 21 of the semiconductor device 20 and the first connection surface 11 of the circuit board 10. In addition, controlling the load by the heater head makes it possible to control the height g11 of the first gap G11 and the height g12 of the second gap G12 illustrated in FIG. 1 to desired values.

In the present embodiment, the description has been given of the example in which the circuit board 10 is fixed, and a pressure is applied to the semiconductor device 20 to apply a load to the first metal bumps 30 and the second metal bumps 40; however, the present invention is not limited thereto. For example, in place of applying a pressure to the semiconductor device 20 or in addition to applying a pressure to the semiconductor device 20, a pressure in the positive direction of the Z-axis may be applied to the circuit board 10 to apply a load to the first metal bumps 30 and the second metal bumps 40.

A description will now be given of modified examples of the electronic circuit 100 described above. The same or similar reference signs will be assigned to the same or similar constituents as those of the electronic circuit 100 illustrated in FIG. 1, and the description thereof will be omitted as appropriate. In addition, like advantageous effects due to like constituents will not be mentioned each time.

First Modified Example

Figure 11:
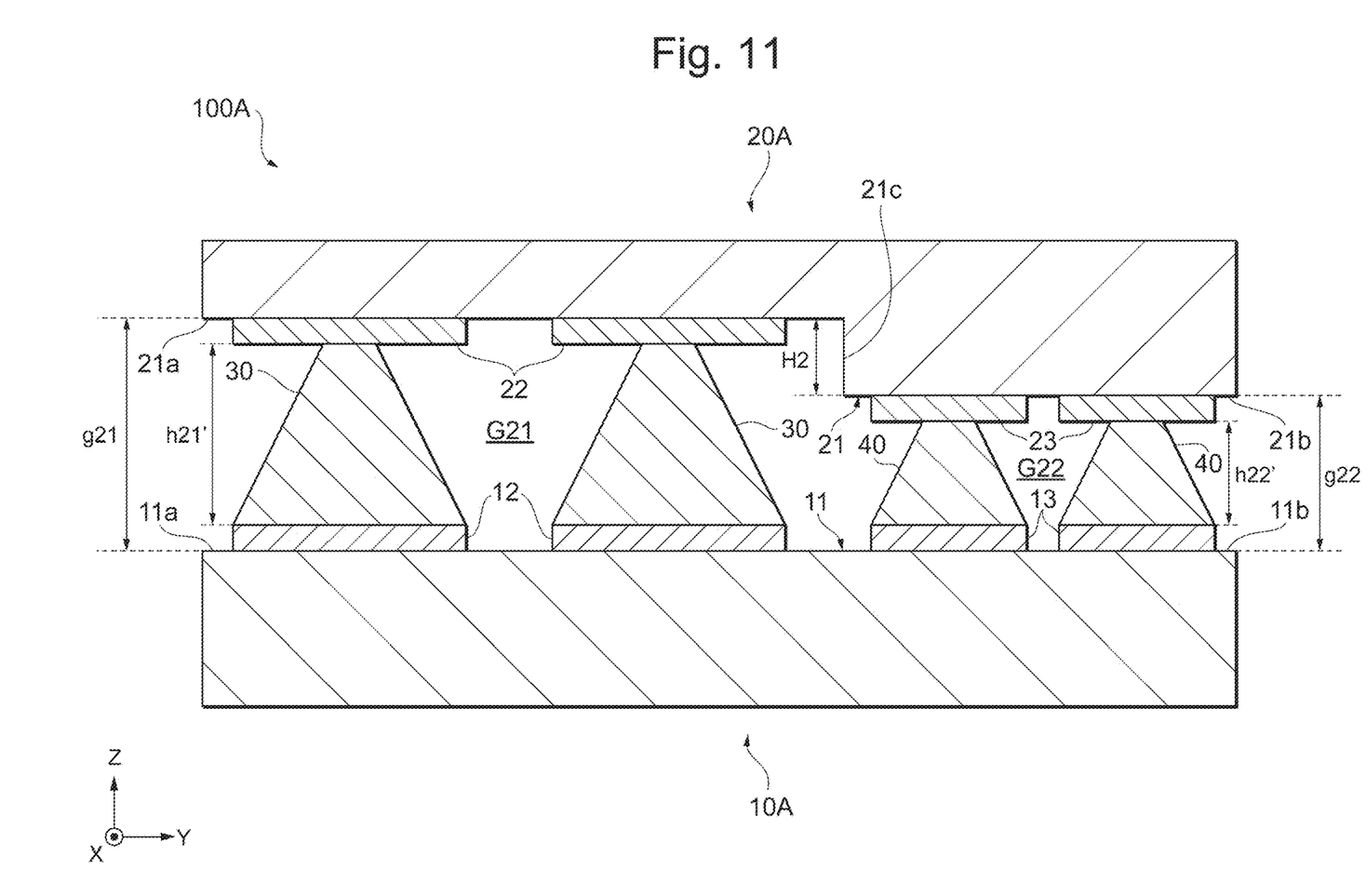
FIG. 11 is a sectional view schematically illustrating the configuration of a first modified example of the electronic circuit illustrated in FIG. 1.

FIG. 11 is a sectional view schematically illustrating the configuration of a first modified example of the electronic circuit 100 illustrated in FIG. 1.

As illustrated in FIG. 11, an electronic circuit 100A differs from the electronic circuit 100 illustrated in FIG. 1 in that a first connection surface 11 of a circuit board 10A is a substantially flat surface with no step and that a second connection surface 21 of a semiconductor device 20A has a step 21c between a third region 21a and a fourth region 21b.

To be specific, the step 21c has a height H2. Further, first metal bumps 30 have a height h21', and second metal bumps 40 have a height h22'. The first metal bumps 30 and the second metal bumps 40 have different heights (height h21'≠height h22') so as to correct the height H2 of the step 21c of the second connection surface 21.

More specifically, the height h21' of the first metal bumps 30 is larger than the height h22' of the second metal bumps 40 (height h21'>height h22'), and the difference is substantially the same as the height H2 of the step 21c (height h21'−height h22'≈height H2).

In addition, a first gap G21 is formed between a first region 11a of a first connection surface 11 and a third region 21a of a second connection surface 21, and a second gap G22 is formed between a second region 11b of the first connection surface 11 and a fourth region 21b of the second connection surface 21. The height h21' of the first metal bumps 30 is proportional to a height g21 of the first gap G21, and the height h22' of the second metal bumps 40 is proportional to a height g22 of the second gap G22.

Second Modified Example

Figure 12:
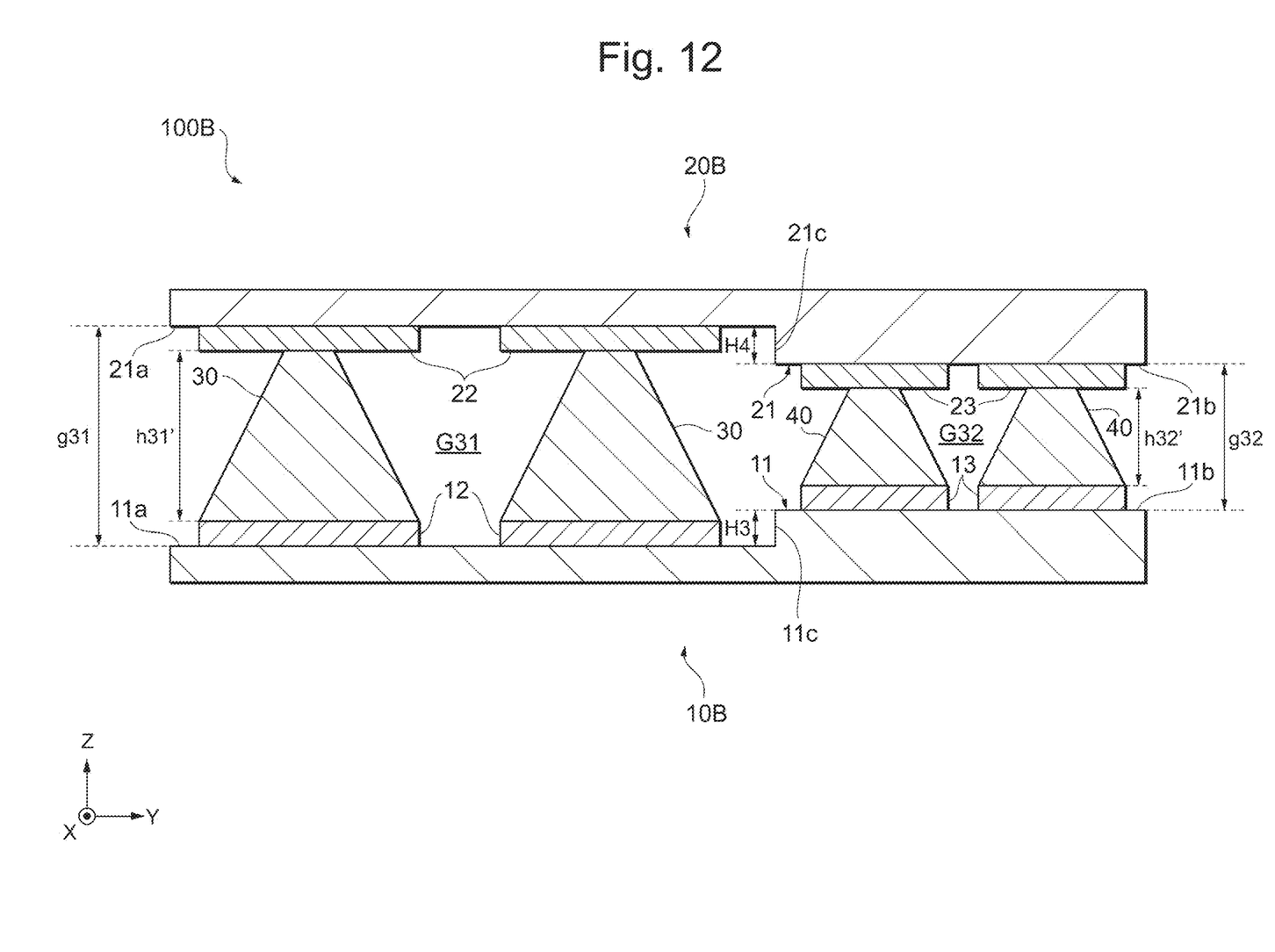
FIG. 12 is a sectional view schematically illustrating the configuration of a second modified example of the electronic circuit illustrated in FIG. 1.

FIG. 12 is a sectional view schematically illustrating the configuration of a second modified example of the electronic circuit 100 illustrated in FIG. 1.

As illustrated in FIG. 12, an electronic circuit 100B differs from the electronic circuit 100 illustrated in FIG. 1 in that a first connection surface 11 of the circuit board 10B has a step 11c, and a second connection surface 21 of a semiconductor device 20B has a step 21c between a third region 21a and a fourth region 21b.

To be specific, the step 11c has a height H3, and the step 21c has a height H2. Further, first metal bumps 30 have a height h31', and second metal bumps 40 have a height h32'. The first metal bumps 30 and the second metal bumps 40 have different heights (height h31'≠height h32') so as to correct the height H3 of the step 11c of the first connection surface 11 and a height H4 of the step 21c of the second connection surface 21.

More specifically, the height h31' of the first metal bumps 30 is greater than the height h32' of the second metal bumps 40 (height h31'>height h32'), and the difference is substantially the same as the total (sum) of the height H3 of the step 11c and the height H4 of the step 21c (height h31'−height h32'≈height H3+height H4).

In addition, a first gap G31 is formed between the first region 11a of the first connection surface 11 and the third region 21a of the second connection surface 21, and a second gap G32 is formed between the second region 11b of the first connection surface 11 and a fourth region 21b of the second connection surface 21. The height h31' of the first metal bumps 30 is proportional to a height 31 of the first gap G31, and the height h32' of the second metal bumps 40 is proportional to a height g32 of the second gap G32.

The above has described exemplary embodiments of the present invention. According to the connection method for the electronic circuit 100 of an embodiment of the present invention, the first metal bumps 30 and the second metal bumps 40 have different heights so as to correct the height H1 of the step 11c of the first connection surface 11. This makes it possible to reduce the difference in joining condition, such as a joining force in the joining surfaces, which may occur due to the height H1 of the step 11c. Consequently, homogeneous joining that has good electrical characteristics can be achieved, enabling the reliability of electrical connection to be improved.

Further, according to the electronic circuit 100 of an embodiment of the present invention, the first metal bumps 30 and the second metal bumps 40 have different heights so as to correct the height H1 of the step 11c of the first connection surface 11. This makes it possible to reduce the difference in joining condition, such as a joining force in the joining surfaces, which may occur due to the height H1 of the step 11c. Consequently, homogeneous joining that has good electrical characteristics can be achieved, enabling the reliability of electrical connection to be improved.

The embodiments described above are intended for easy understanding of the present invention, and are not to be considered as limiting the present invention. The elements provided in the embodiments, and the placement, materials, conditions, shapes, sizes and the like of the elements are not limited to those illustrated, but can be changed as appropriate. Further, some of the constituents shown in different embodiments can be replaced or combined.

REFERENCE SIGNS LIST 10, 10A, 10B . . . circuit board; 11 . . . first connection surface; 11a . . . first region; 11b . . . second region; 11c . . . step; 12 . . . first electrode pad; 13 . . . second electrode pad; 20, 20A, 20B . . . semiconductor device; 21 . . . second connection surface; 21a . . . third region; 21b . . . fourth region; 21c . . . step; 22 . . . third electrode pad; 23 . . . fourth electrode pad; 30 . . . first metal bump;

40 ... second metal bump; 100, 100A, 100B ... electronic circuit; AP1, AP2 ... opening; d1, d2 ... diameter; G11, G21, G31 ... first gap; G12, G22, G32 ... second gap; HO1 ... first hole; HO2 ... first hole; PR ... photoresist film; SL ... sediment layer; SN ... spray nozzle; and ST ... stage device.

What is claimed is:

1. An electronic circuit connection method for electrically connecting a first connection surface, in which a first electrode pad is provided in a first region and a second electrode pad is provided in a second region, and a second connection surface, in which a third electrode pad is provided in a third region facing the first region and a fourth electrode pad is provided in a fourth region facing the second region, comprising:
   a process of forming a first metal bump and a second metal bump, each of which has a cone shape; and
   a process of joining the first electrode pad and the third electrode pad by the first metal bump and joining the second electrode pad and the fourth electrode pad by the second metal bump,
   wherein at least one region of between the first region and the second region in the first connection surface and between the third region and the fourth region in the second connection surface has a step, and
   the first metal bump and the second metal bump have different heights so as to correct a height of the step.

2. The electronic circuit connection method according to claim 1,
   wherein the process of joining includes forming a first gap between the first region of the first connection surface and the third region of the second connection surface, and forming a second gap between the second region of the first connection surface and the fourth region of the second connection surface,
   a height of the first metal bump is proportional to a height of the first gap, and
   a height of the second metal bump is proportional to a height of the second gap.

3. The electronic circuit connection method according to claim 1,
   wherein the process of forming includes forming the first metal bump and the second metal bump together.

4. The electronic circuit connection method according to claim 1,
   wherein the process of forming includes:
   forming a photoresist film on the first connection surface;
   forming a first hole and a second hole, openings of which have different diameters, in the photoresist film;
   spraying a gas that contains metal particles toward the photoresist film to cause the metal particles to accumulate inside each of the first hole and the second hole; and
   removing the photoresist film from the first connection surface.

5. The electronic circuit connection method according to claim 4,
   wherein the height of the first metal bump is proportional to the diameter of the opening of the first hole, and
   the height of the second metal bump is proportional to the diameter of the opening of the second hole.

6. The electronic circuit connection method according to claim 1,
   wherein the process of forming includes forming the first metal bump and the second metal bump into similar cone shapes.

7. The electronic circuit connection method according to claim 1,
   wherein the process of joining includes applying a predetermined load to the first metal bump and the second metal bump.

8. An electronic circuit comprising:
   a first constituent element having a first connection surface in which a first electrode pad is provided in a first region and a second electrode pad is provide in a second region;
   a second constituent element having a second connection surface in which a third electrode pad is provided in a third region facing the first region and a fourth electrode pad is provided in a fourth region facing the second region;
   a first metal bump which has a cone shape and which joins the first electrode pad and the third electrode pad; and
   a second metal bump which has a cone shape and which joins the second electrode pad and the fourth electrode pad,
   wherein at least one region of between the first region and the second region in the first connection surface and between the third region and the fourth region in the second connection surface has a step, and
   the first metal bump and the second metal bump have different heights so as to correct a height of the step.

9. The electronic circuit according to claim 8,
   wherein a height of the first metal bump is proportional to a height of a first gap formed between the first region of the first connection surface and the third region of the second connection surface, and
   a height of the second metal bump is proportional to a height of a second gap formed between the second region of the first connection surface and the fourth region of the second connection surface.

10. The electronic circuit according to claim 8,
    wherein the first metal bump and the second metal bump have similar cone shapes.

11. The electronic circuit according to claim 8,
    wherein a tip portion of each of the first metal bump and the second metal bump is subjected to a predetermined load and compressed.

* * * * *